United States Patent [19]
Frembgen

[11] Patent Number: 6,099,715
[45] Date of Patent: Aug. 8, 2000

[54] METHOD FOR ELECTROCHEMICAL TREATMENT, ESPECIALLY FOR POLISHING

[76] Inventor: Fritz-Herbert Frembgen, Erfurterstr. 31, D-87700 Memmingen, Germany

[21] Appl. No.: 09/166,006

[22] Filed: Oct. 5, 1998

[30] Foreign Application Priority Data

Aug. 7, 1998 [EP] European Pat. Off. .............. 98114849

[51] Int. Cl.⁷ .................................................. B23H 3/00
[52] U.S. Cl. ...................... 205/652; 205/672; 204/224 M
[58] Field of Search ....................... 204/224 M; 205/651, 205/652, 654, 672, 686

[56] References Cited

U.S. PATENT DOCUMENTS

| | | | |
|---|---|---|---|
| 3,293,163 | 12/1966 | O'Connor | 204/143 |
| 3,616,343 | 10/1971 | Inoue | 204/143 M |
| 4,222,834 | 9/1980 | Bacon et al. | 204/129.6 |
| 4,486,279 | 12/1984 | Fromson et al. | 204/129.5 |
| 5,378,331 | 1/1995 | Kemp | 204/129.7 |

FOREIGN PATENT DOCUMENTS

| | | |
|---|---|---|
| 0520324 | 6/1992 | European Pat. Off. . |
| 0663461 | 12/1994 | European Pat. Off. . |
| 1465431 | 2/1977 | United Kingdom . |
| 2203756 | 10/1988 | United Kingdom . |
| 9314249 | 7/1993 | WIPO . |

OTHER PUBLICATIONS

European Search Report for European Appln. No. 98114849.7, dated Jan. 19, 1999.

*Primary Examiner*—Kathryn Gorgos
*Assistant Examiner*—Erica Smith-Hicks
*Attorney, Agent, or Firm*—Notaro & Michalos P.C.

[57] ABSTRACT

During continuous electrochemical polishing of a metallic workpiece an electrolyte flows through a cathodic part of a tool into a working gap formed between the cathodic part and the workpiece and leaves it through a discharge channel between the cathodic part and a wall of the tool. Between the tool's wall and the workpiece a clearance is formed bordering the working gap. To avoid flow of the electrolyte from the working gap into the clearance and to discharge fluid from the gap, a chamber is provided which contains an external fluid held under a pre-adjusted pressure, which can be above or below atmospheric pressure in relation to the pressure of the electrolyte in the working gap. The fluid's pressure is adjusted so, that at the beginning of the clearance a barrier against the penetration of electrolyte liquid is formed. At this barrier the electrolyte is separated from the surface of the workpiece alongside a distinctive breakaway edge. Due to this the polishing treatment results in a constantly good high-polishing surface without any discolorations.

10 Claims, 3 Drawing Sheets

METHOD FOR ELECTROCHEMICAL TREATMENT, ESPECIALLY FOR POLISHING

BACKGROUND OF THE INVENTION

The invention relates to a method for electrochemical treatment, especially for polishing of workpieces with metallic surfaces, where the workpiece is an anode and a tool the respective cathode, the workpiece is moved continuously relative to the tool and an electrolyte flows between tool and workpiece, the electrolyte flow contacts the workpiece in a first area and is removed from the workpiece over the tool at least at a second area, whereby the electrochemical treatment of the workpiece takes place in the areas wetted by the electrolyte flow.

Prior Art

A method of this kind is known from EP 0 663 461 A1. The electrolyte is pressed into a cushion through the cathode via a pump, the cushion protrudes somewhat into the workgap between anode and cathode. The periphery of the cushion borders an annular chamber of the tool, in which a suction pump creates low pressure. The suction pump recollects used electrolytic liquid into a storage container. The cushion shall serve to limit the electrolyte wetting of the tool.

According to the U.S. Pat. No. 4,486,279 the cathode is at both sides surrounded by a wall of the tool, creating a flow chamber. The electrolyte flows into the working gap at one side of the cathode and leaves it at the other side of the cathode. The clearances between the wall and the workpiece existing at both sides of the working gap have no sealing means, so that a local restriction of the working area cannot be achieved.

From the EP 0 520 324 A1 an apparatus is known, which is not used for electromechanical treatment but for etching of circuit boards. At this apparatus the etchant is applied to the middle of the circuit board in a limited chamber and then drawn off at both sides spaced therefrom. The clearances are equipped with sealing means such as brushes or rollers.

Electromechanical treatment, especially electropolishing, takes material of the surface of the workpiece, whereby pressed-in impurities are removed. Hydroxide settlements during polishing can produce discolorations in relation to the respective current density. Current densities below about 0.5 $A/mm^2$ (depending on the material composition) and low flow velocities of the electrolyte cause these discolorations. The current density is highest, where the cathode is facing the anodic workpiece and decreases with increasing distance between the cathode and anodic workpiece. Polishing effect is best when the cathode faces the anode and with close proximity between the two. With increasing distance from the cathode the current density decreases exponentially and the polishing effect decreases clear-cut. Discolorations occur, which relatively diminish with increasing distance to the cathode or a decrease in current density.

SUMMARY OF THE INVENTION

To avoid such discolorations during electrochemical polishing the most exact limitation of the electrolyte wetting of the workpiece in the working gap is important. The proposals described before are insufficient for the continuous polishing treatment.

One object of the invention is to propose a method and an apparatus, which allow continuous treatment of a workpiece's surface of any geometrical shape and whereby at the same time discolorations of the workpiece's surface are avoided as far as possible.

A further object of the invention is to provide a method and an apparatus for electrochemical treatment, especially electrochemical polishing, of a workpiece with metallic surface, where the workpiece forms an anode and a tool the cathode, the workpiece is moved relatively and continuously to the tool and an electrolyte flows between workpiece and tool, which gets contact to the workpiece in a first area and is removed from the workpiece over the tool in at least one second area, whereby the electrochemical treatment is effected in the areas wetted by the flow of electrolyte, and whereby at one of the said areas a fluid barrier for the flow of electrolyte is produced by means of a non-electrolytic external fluid, the barrier forming a distinctive breakaway edge for the electrolyte flow at the surface of the workpiece.

Experience has shown, that sucking off the electrolyte at both ends of the working gap is unsufficent to limit the treatment area, even when the adjacent clearances are equipped with sealing means. In contrast to that this object is reached with the external fluid of the instant invention—which—in the most simple case—forms a pressurized fluid cushion, which becomes effective in the clearance area and there generates a distinctive breakaway edge for the electrolyte flow. By adjusting the pressure in the fluid supply this breakaway edge can be moved either to the clearance's end facing the working gap or deeper into the clearance itself. As a result it is simple to position the barrier for the electrolyte so, that at the barrier the current density is still sufficient, and so that the polishing treatment is at it's optimum without discolorations.

Instead of high-pressure in the fluid supply there can also be supplied low pressure, which corresponds with the pressure of the electrolyte flow.

One further object of the invention is to propose an apparatus for electrochemical treatment, especially electrochemical polishing of a workpiece with metallic surface, which forms an anode, with a tool comprising a cathode, whereby between workpiece and tool a working gap is formed and the tool comprises a supply channel and a discharge channel for electrolyte liquid, both leading into the working gap, and whereby next to the cathode at each side a respective wall is provided, which together with the workpiece form a clearance following the working gap, with a channel leading into the clearance, which is connected to the supply of external fluid being adjustable in relation to the pressure of the electrolyte flow.

Further features of the invention include a closed chamber opposite the working gap, the chamber extending most of the working length of the workpiece, positioned at a right angle to the relative movement of the workpiece. The closed chamber contains an external fluid. A bottom wall of the chamber, together with the workpiece form a clearance extension with sealing means against the workpiece at the opposite end of the working gap. These sealing means, as known per se, can consist of brush strips or rotatable rollers. With these sealing means leakage losses of the external fluid are kept low. It is understood by the way that the external fluid is controlled to have a constant pressure.

The external fluid preferably is a gaseous fluid, such as air or an inert gas, even though in some cases it can be advantageous to use a liquid, especially a thick-flowing fluid, which does not combine with the electrolyte or can easily be separated again.

Preferred embodiments of the invention are shown in the drawing.

DESCRIPTION OF THE PREFERRED EMBODIMENTS

Figure 1:
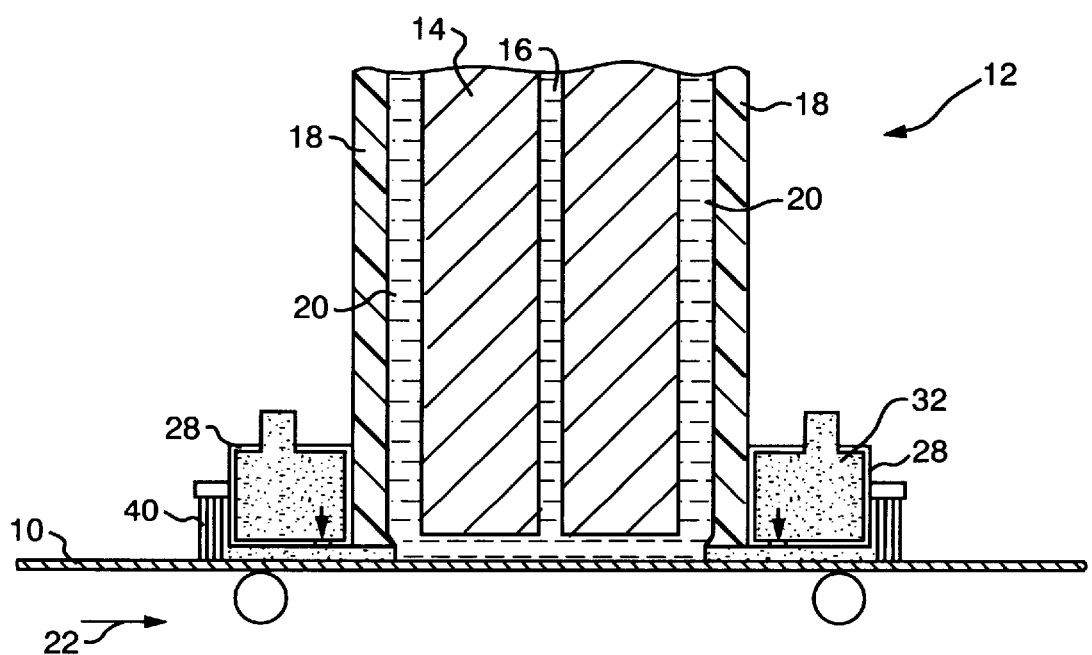
FIG. 1 shows a schematic view of an apparatus for continuous electrochemcial polishing of a metallic workpiece.
Figure 2:
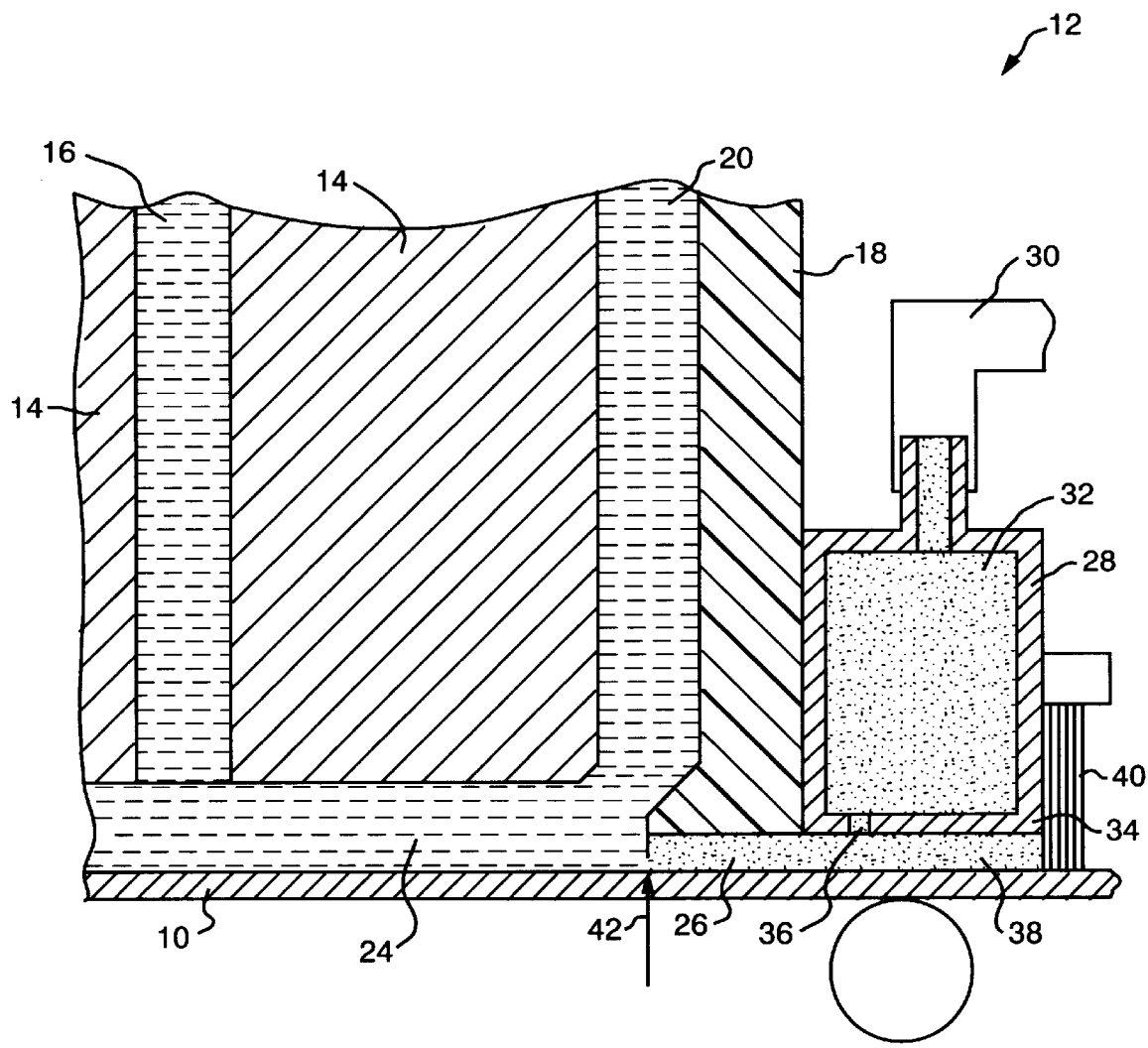
FIG. 2 shows a view of the apparatus according to FIG. 1 in larger scale.

A tool 12 for electrochemical polishing of a workpiece 10 with metallic surface has a central cathode 14, which is connected to a negative terminal of a direct voltage source. The positive terminal is connected to the workpiece 10. Inside the cylindrical cathode 14 is a supply channel 16 for electrolyte liquid. In a distance at both sides of the cathode 14 are walls 18, e.g. made out of plastics. Between the cathode 14 and wall 18 discharge channels 20 for the electrolyte are formed.

The tool 12 with cathode 14 and walls 18 can be cylindrical or square in configuration, and is formed such that it's lengthways direction is vertical to the drawing plane.

The workpiece 10 moves in direction of arrow mark 22 from left to right. But it also is within the range of the invention to fix the workpiece 10 in one position and move the tool 12 instead.

The cathode 14 has a respective distance to the workpiece 10. This distance forms a working gap 24. In operation the electrolyte flows under pressure through the supply channel 16 into the working gap 24, fills it and then leaves the working gap via the discharge channels 20. The walls 18 of the tool 12 protrude beyond the cathode 14 a little bit in the direction of the workpiece 10, even though this is not mandatory. In each case, a clearance 26 is formed between each wall 18 and the workpiece 10. This clearance should be avoided as it is a leakage area for the electrolyte flow and can result in unwanted discolorations on the surface of the workpiece 10 during polishing.

Refering to a cylindric tool 12 a chamber 28 surrounds the circular wall 18. Refering to a cuboid workpiece 10 the chamber 28 extends lengthways vertically to the drawing plane and is positioned at the front wall 18 relative to the moving direction of the workpiece 10. The backwall 18 does not need such a chamber 28, in case the respective clearance can be suffiently sealed another way. The embodiment shows a respective chamber 28 at each of both walls 18. This chamber contains a pressurized fluid, which is completed via a supply channel 30. A predetermined pressure of the fluid 32 in the chamber 28 is controlled by a pressure sensor (not shown) and a valve. The chamber 28 is equipped with a channel 36 over the whole length of the bottom wall 34, which leads into the clearance 26. A clearance extension 38 is formed between bottom wall 34, chamber 28 and workpiece 20, which is closed at the outside by sealing means 40 in shape of brush strips.

During the electrochemical polishing the electrolyte flow in the working gap 24 is under respective overpressure, e.g. 0.5 bar. The fluid 32 pressure in the chamber 28 now is adjusted to a value, which as a first step is near the pressure in the working gap 24, but can vary a little bit up- or downwards according to the shape of the tool 12. In the embodiment the pressure of the fluid 32 in the chamber 28 is set to just below 0.5 bar, resulting in the fact, that the electrolyte penetrates into the clearance 26 a little bit, leading to a small compression of the fluid, but the fluid functions as a barrier 42 against the further penetration of the electrolyte. At this barrier 42 the electrolyte is separated from the workpiece 10. A distinctive breakaway edge is formed, so that the polishing operation—in relation to a stationary workpiece 10—is ending at this edge. When the workpiece is moved, the breakaway edge moves contrary to the workpiece's direction over the surface of the workpiece to the rear.

In case the pressure in the chamber 28 is adjusted a little bit higher compared to the corresponding pressure in the working gap 24, the fluid would penetrate into the working gap 24 a little bit and would be drawn off through the discharge channel 20 together with the electrolyte. A gaseous fluid 32 would form bubbles in the electrolyte when entering the working gap 24 and the bubbles would escape through the discharge channel 20. The barrier 42 in this case also is built up, so that the breakaway edge is only slightly moved contrary to the moving direction of the workpiece 10.

Figure 3:
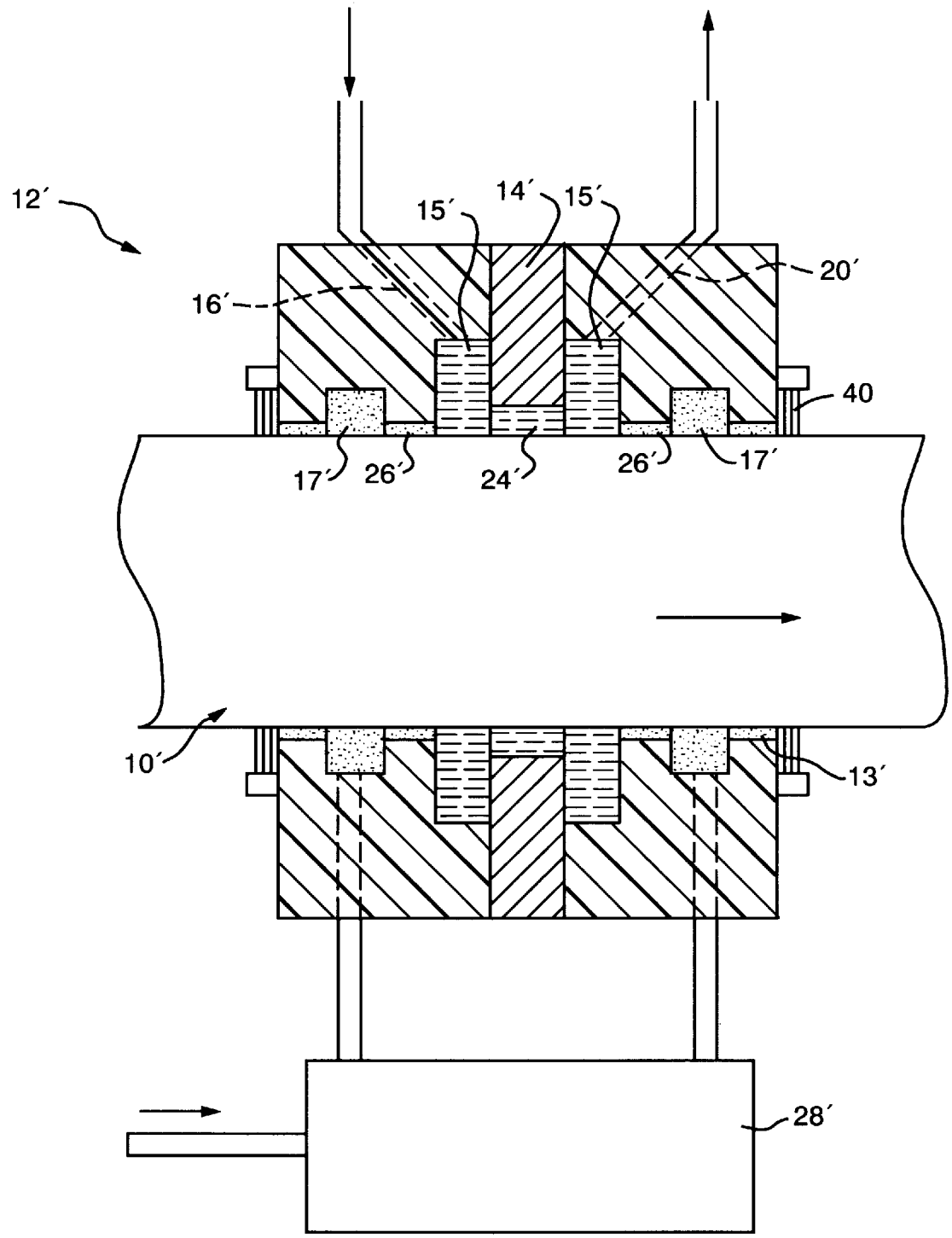
FIG. 3 shows a schematic view of an apparatus for polishing of circular workpieces.

The tool 12' according to FIG. 3 serves for electrochemical polishing of circular workpieces 10'. The tool 12' has a circular bore 13' with a diameter slightly larger than the outer diameter of the workpiece 10'. An annular cathode 14' is in the middle level of the tool 12' and forms a working gap 24' with the workpiece 10'. At both sides of the cathode 14' the tool 12' shows annular grooves 15', with the supply channel 16' leading into one of them and the discharge channel 20' into the other. Through the supply channel 16' the electrolyte liquid is distributed in the annular chamber formed by the annular groove 15', then flows axially through the working gap 24' and leaves the annular chamber through the discharge channel 20'.

At the sides of the annular grooves 15', which lie opposite to the working gap 24', in an axial distance further annular grooves 17' are provided, which are connected to the chamber 28' via bores containing the fluid supply. In operation the pressure of the external fluid in each annular groove 17' is adjusted to the pressure of the electrolyte in the annular grooves 15'. This pressure adjustment builds up in the clearances 26' barriers against the penetration of electrolyte by forming distinctive breakaway edges at the circumsphere of the workpiece 10'.

What is claimed is:

1. Method for electrochemical treatment of a workpiece with metallic surface, where the workpiece forms an anode and a tool the cathode, the workpiece is moved relatively and continuously to the tool and an electrolyte flows between workpiece and tool, which contacts the workpiece in a first area and is removed from the workpiece over the tool in at least one second area, wherein the electrochemical treatment is effected in the areas wetted by the flow of electrolyte, and wherein at one of said areas a fluid barrier for the flow of electrolyte is produced by means of a non-electrolytic external fluid, the barrier forming a distinctive breakaway edge for the electrolyte flow at the surface of the workpiece.

2. Method as claimed in claim 1, wherein the position of the breakaway edge of the electrolyte flow is adjusted by changing the pressure difference between the pressure of the electrolyte flow in the working gap and the pressure of the external fluid.

3. Method as claimed in claim 1, wherein the external fluid is gaseous.

4. Method as claimed in claim 1, wherein the external fluid is held under a pressure above atmospheric pressure.

5. Apparatus for electrochemical treatment of a workpiece with metallic surface, which forms an anode, with a tool comprising a cathode, wherein between workpiece and tool a working gap is formed and the tool comprises a supply channel and a discharge channel for electrolyte liquid, both leading into the working gap, and whereby next to the cathode at each side a respective wall is provided, which together with the workpiece form a clearance following the working gap, with a channel leading into the clearance, which is connected to a supply of external fluid with a pressure being adjustable in relation to the pressure of the electrolyte flow.

6. Apparatus as claimed in claim 5, wherein a closed chamber is connected to the clearance at the opposite side of the working gap, the chamber extending most of the working length measured right-angled to the relative movement of the workpiece, said chamber adapted for containing the external fluid.

7. Apparatus as claimed in claim 5, wherein a bottom wall of the chamber together with the workpiece forms a clearance extension with sealing means against the workpiece at the opposite end of the working gap.

8. Apparatus as claimed in claim 5, wherein the supply of external fluid forms a compressed air cushion.

9. Apparatus as claimed in claim 5, wherein the external fluid consists of a liquid which is not mixable with the electrolyte.

10. Apparatus as claimed in claim 5, wherein the external fluid can easily be separated from the electrolyte.

* * * * *